United States Patent
Orlov et al.

(10) Patent No.: US 12,269,071 B2
(45) Date of Patent: Apr. 8, 2025

(54) SYSTEMS AND METHODS FOR SELF-CLEANING SOLAR PANELS USING AN ELECTRODYNAMIC SHIELD

(71) Applicant: The Research Foundation for the State University of New York, Albany, NY (US)

(72) Inventors: Alexander Orlov, Smithtown, NY (US); Shrish Patel, Maharashtra (IN); James F. Smith, Lake Wylie, SC (US)

(73) Assignee: The Research Foundation for the State University of New York, Albany, NY (US)

(*) Notice: Subject to any disclaimer, the term of this patent is extended or adjusted under 35 U.S.C. 154(b) by 192 days.

(21) Appl. No.: 16/646,193

(22) PCT Filed: Sep. 11, 2018

(86) PCT No.: PCT/US2018/050321
§ 371 (c)(1),
(2) Date: Mar. 11, 2020

(87) PCT Pub. No.: WO2019/051438
PCT Pub. Date: Mar. 14, 2019

(65) Prior Publication Data
US 2020/0276621 A1    Sep. 3, 2020

Related U.S. Application Data

(60) Provisional application No. 62/557,070, filed on Sep. 11, 2017.

(51) Int. Cl.
*B08B 6/00* (2006.01)
*B08B 17/06* (2006.01)
(Continued)

(52) U.S. Cl.
CPC ............ *B08B 6/00* (2013.01); *B08B 17/06* (2013.01); *B60S 1/02* (2013.01); *B60S 1/56* (2013.01);
(Continued)

(58) Field of Classification Search
None
See application file for complete search history.

(56) References Cited

U.S. PATENT DOCUMENTS

| 3,346,475 A | 10/1967 | Matkan et al. |
| RE29,398 E | 9/1977 | Inoue |

(Continued)

FOREIGN PATENT DOCUMENTS

| CN | 104588369 A | 5/2015 |
| CN | 107873081 B | 3/2020 |

(Continued)

OTHER PUBLICATIONS

First Office Action, along with an English translation, dated Nov. 17, 2021, issued by the China National Intellectual Property Admisinstration, issued in connection with Chinese Patent Application No. 201880058934.7 (16 pages).

(Continued)

*Primary Examiner* — Natasha N Campbell
*Assistant Examiner* — Pradhuman Parihar
(74) *Attorney, Agent, or Firm* — McCarter & English, LLP

(57) ABSTRACT

Systems and methods for self-cleaning a surface of an object where an electrodynamic shield is mounted to a surface of the object. The electrodynamic shield includes one or more sets of electrodes atop a substrate, at least one or more sets of electrodes being covered in a protective film. A coating is applied to the top surface of the protection film. A signal pulse generator is connected to the one or more sets of (Continued)

electrodes. The signal pulse generator generates a pulse signal that causes the one or more sets of electrodes to generate an electric field. The pulse signal comprises a plurality of different pulse signals which have phase differences between consecutive signals, and the electric field causes a particle atop the coating to experience an electrostatic force and be repelled away from the coating. These pulse signals (including shapes, amplitudes, shifts, and frequencies) can be tuned to increase efficiency of removal depending on dust type and relative humidity.

24 Claims, 12 Drawing Sheets

(51) Int. Cl.
  *B60S 1/02* (2006.01)
  *B60S 1/56* (2006.01)
  *B60S 1/62* (2006.01)
  *H01L 31/048* (2014.01)
  *H02S 40/10* (2014.01)

(52) U.S. Cl.
  CPC ............ *B60S 1/62* (2013.01); *H01L 31/0488* (2013.01); *H02S 40/10* (2014.12)

(56) References Cited

U.S. PATENT DOCUMENTS

| | | |
|---|---|---|
| RE29,399 E | 9/1977 | Inoue |
| 4,963,239 A | 10/1990 | Shimamura et al. |
| 5,018,180 A | 5/1991 | Shoulders |
| 5,054,046 A | 10/1991 | Shoulders |
| 5,054,047 A | 10/1991 | Shoulders |
| 5,123,039 A | 6/1992 | Shoulders |
| 5,148,461 A | 9/1992 | Shoulders |
| 5,153,901 A | 10/1992 | Shoulders |
| 5,922,180 A | 7/1999 | Hoshino |
| 5,968,377 A | 10/1999 | Yuasa et al. |
| 5,985,375 A | 11/1999 | Donohoe et al. |
| 6,156,162 A | 12/2000 | Hoard |
| 6,163,098 A | 12/2000 | Taylor et al. |
| 6,350,417 B1 | 2/2002 | Lau et al. |
| 6,466,039 B1 | 10/2002 | Gruverman |
| 6,504,524 B1 | 1/2003 | Gates et al. |
| 6,531,997 B1 | 3/2003 | Gates et al. |
| 6,554,979 B2 | 4/2003 | Stimson |
| 6,660,930 B1 | 12/2003 | Gonsiorawski |
| 6,673,724 B2 | 1/2004 | Forster et al. |
| 6,724,609 B2 | 4/2004 | Sun et al. |
| 6,908,501 B2 | 6/2005 | Reeves et al. |
| 6,911,593 B2 | 6/2005 | Mazumder et al. |
| 7,056,370 B2 | 6/2006 | Reeves et al. |
| 7,123,864 B2 | 10/2006 | Miyaguchi et al. |
| 7,220,295 B2 | 5/2007 | Lau et al. |
| 7,517,505 B2 | 4/2009 | Botvinnik et al. |
| 7,662,237 B2 | 2/2010 | Chaleix et al. |
| 7,999,173 B1 | 8/2011 | Ashpis |
| 8,373,120 B2 | 2/2013 | Verentchikov |
| 8,513,531 B2 | 8/2013 | Trigwell et al. |
| 8,542,852 B2 | 9/2013 | Kageyama |
| 8,559,852 B2 | 10/2013 | Hirakawa |
| 8,756,739 B1 | 6/2014 | Potter et al. |
| 8,823,394 B2 | 9/2014 | Reime |
| 8,828,883 B2 | 9/2014 | Rueger |
| 8,881,535 B2 | 11/2014 | Hartwick et al. |
| 9,192,278 B2 | 11/2015 | Chan et al. |
| 9,243,800 B2 | 1/2016 | Goodson et al. |
| 9,358,380 B2 | 6/2016 | Ivanoff et al. |
| 9,433,336 B2 | 9/2016 | Mazumder |
| 11,069,515 B2 | 7/2021 | Ruzic et al. |
| 11,110,493 B2 | 9/2021 | Tombs et al. |
| 2004/0055632 A1 | 3/2004 | Mazumder et al. |
| 2007/0017567 A1 | 1/2007 | Gronet et al. |
| 2007/0148061 A1 | 6/2007 | Lau et al. |
| 2008/0106206 A1 | 5/2008 | Hooke et al. |
| 2008/0204435 A1 | 8/2008 | Miyamoto |
| 2008/0236740 A1 | 10/2008 | Gibson et al. |
| 2010/0035052 A1 | 2/2010 | Farah |
| 2010/0101624 A1 | 4/2010 | Fioretti et al. |
| 2011/0283477 A1* | 11/2011 | Ashpis ............... H02S 40/10 15/405 |
| 2012/0126716 A1 | 5/2012 | Hirakawa |
| 2012/0285516 A1 | 11/2012 | Mckarris |
| 2013/0015723 A1* | 1/2013 | DiLuciano ............ H01H 47/32 307/143 |
| 2013/0263393 A1* | 10/2013 | Mazumder .......... H01L 31/0543 427/535 |
| 2014/0162206 A1 | 6/2014 | Ivanoff et al. |
| 2014/0261536 A1* | 9/2014 | Buhler ................ B08B 17/06 134/1 |
| 2016/0126367 A1* | 5/2016 | Dunton ............... H03K 17/687 307/115 |
| 2017/0076676 A1 | 3/2017 | Hadwen |
| 2017/0338771 A1 | 11/2017 | Gostein et al. |
| 2018/0358213 A1 | 12/2018 | Ruzic et al. |
| 2021/0061648 A1 | 3/2021 | Towfighian et al. |
| 2023/0046053 A1 | 2/2023 | Orlov et al. |
| 2023/0364655 A1 | 11/2023 | Orlov et al. |

FOREIGN PATENT DOCUMENTS

| | | |
|---|---|---|
| CN | 113164079 A | 7/2021 |
| CN | 110168145 B | 8/2021 |
| DE | 2015212 A1 | 11/1970 |
| DE | 2256528 A1 | 6/1973 |
| DE | 2516217 A1 | 10/1975 |
| DE | 2304944 C3 | 6/1978 |
| DE | 2428494 C3 | 2/1984 |
| DE | 3803737 A1 | 7/1989 |
| DE | 102009020415 A1 | 11/2010 |
| DE | 102020133596 A1 | 9/2021 |
| EP | 0702786 A1 | 3/1996 |
| EP | 1113088 A1 | 7/2001 |
| EP | 1477228 A1 | 11/2004 |
| JO | PI0618588 A2 | 9/2011 |
| JP | S6230825 B2 | 7/1987 |
| JP | H07115000 A | 5/1995 |
| JP | 2001170522 A | 6/2001 |
| JP | 2001274115 A | 10/2001 |
| JP | 2002307740 A | 10/2002 |
| JP | 2002341656 A | 11/2002 |
| JP | 2003265982 A | 9/2003 |
| JP | 2004198675 A | 7/2004 |
| JP | 2005031427 A | 2/2005 |
| JP | 2007502519 A | 2/2007 |
| JP | 3998497 B2 | 10/2007 |
| JP | 2010-118950 A | 5/2010 |
| JP | 2013-518427 A | 5/2013 |
| JP | 2014007739 A | 1/2014 |
| KR | 920007084 B1 | 8/1992 |
| KR | 20000062570 A | 10/2000 |
| KR | 20010078733 A | 8/2001 |
| KR | 102501328 B1 | 2/2023 |
| TW | 201220271 A | 5/2012 |
| TW | 201603108 A | 1/2016 |
| WO | 2002004216 A1 | 1/2002 |
| WO | 2012/078765 A2 | 6/2012 |
| WO | 2013/188420 A1 | 12/2013 |
| WO | 2019/197128 A2 | 10/2019 |
| WO | 2021/037827 A1 | 3/2021 |
| WO | 2023011849 A1 | 2/2023 |
| WO | 2023079404 A1 | 5/2023 |

OTHER PUBLICATIONS

First Examination Report dated Aug. 17, 2021, issued by the Intellectual Property Office of India, issued in connection with Indian Patent Application No. 202027009894 (6 pages).
International Search Report of the International Searching Authority dated Dec. 11, 2018, issued in connection with International Appli-

(56) References Cited

OTHER PUBLICATIONS cation No. PCT/US18/50321 (2 pages).
Written Opinion of the International Searching Authority dated Dec. 11, 2018, issued in connection with International Application No. PCT/US18/50321 (5 pages).
Syafiq, et al., "Advances in Approaches and Methods for Self-Cleaning of Solar Photovoltaic Panels," Solar Energy (online) Retrieved on Mar. 1, 2018, vol. 162, pp. 597-619 (23 pages).
Office Action, along with an English translation, dated Jun. 16, 2022, issued by the Japanese Patent Office, issued in connection with Japanese Patent Application No. 2020-536718 (13 pages).
Second Office Action, along with an English translation, dated Aug. 11, 2022, issued by the China National Intellectual Property Admisinstration, issued in connection with Chinese Patent Application No. 201880058934.7 (21 pages).
Office Action dated Nov. 30, 2022, issued in connection with U.S. Appl. No. 17/974,170 (7 pages).
Notice of Allowance dated Mar. 10, 2023, issued in connection with U.S. Appl. No. 17/974,170 (9 pages).
Office Action, along with an English translation, dated Mar. 30, 2023, issued by the Japanese Patent Office, issued in connection with Japanese Patent Application No. 2020-536718 (11 pages).
Office Action dated Jun. 22, 2023, issued in connection with U.S. Appl. No. 17/974,170 (9 pages).
Office Action dated Jan. 29, 2024, issued in connection with U.S. Appl. No. 17/974,170 (8 pages).
Notification of Provisional Rejection along with an English translation, dated Nov. 25, 2023, issued by the Korean Intellectual Property Office, issued in connection with Korean Patent Application No. 10-2020-7010596 (13 pages).
Office Action dated Mar. 8, 2024, issued in connection with U.S. Appl. No. 18/227,504 (6 pages).
Office Action dated May 6, 2024, issued in connection with U.S. Appl. No. 17/974,170 (10 pages).
Office Action, along with an English translation, dated Jul. 8, 2024, issued by the Japanese Patent Office, issued in connection with Japanese Patent Application No. 2023-123906 (14 pages).
Appeal Decision, along with an English translation, dated Jan. 6, 2025, issued by the Japanese Patent Office, issued in connection with Japanese Patent Application No. 2020-536718 (42 pages).

\* cited by examiner

After

Before

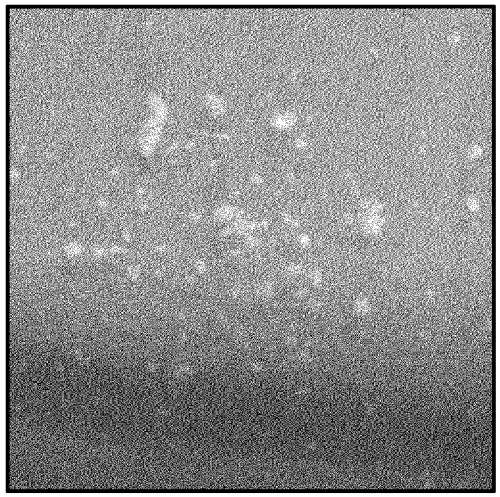
Non-Porous Mineral Dust
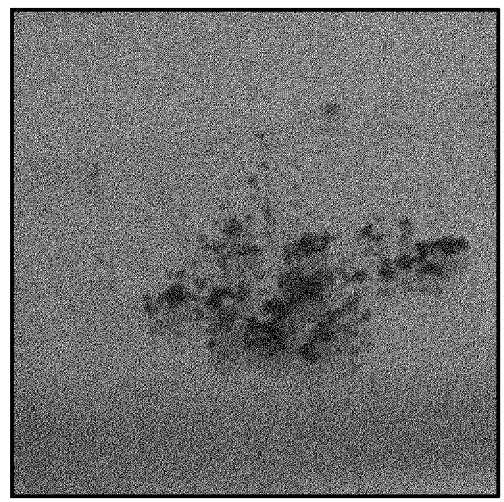
Hydrophobic Organic Dust
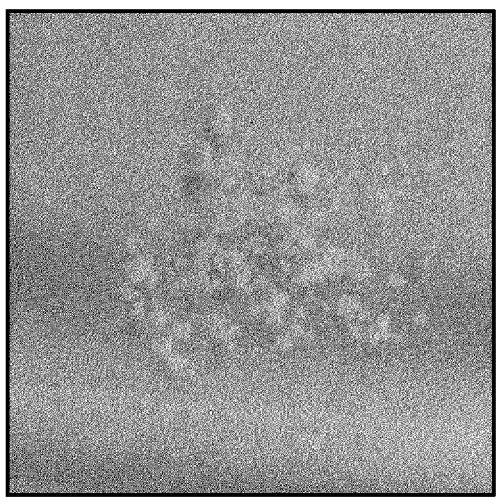
Porous Mineral Dust
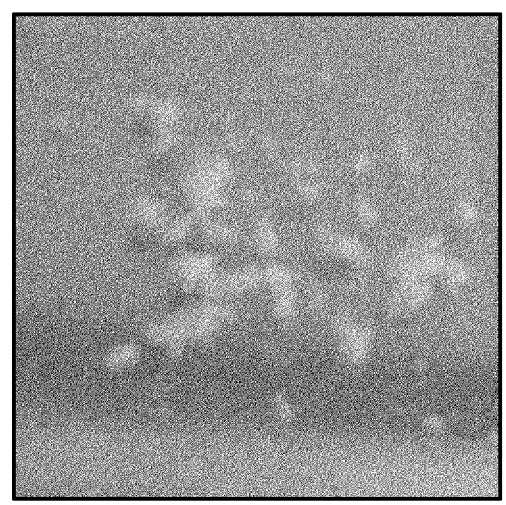
Hydrophilic Organic Dust
FIG. 15

SYSTEMS AND METHODS FOR SELF-CLEANING SOLAR PANELS USING AN ELECTRODYNAMIC SHIELD

CROSS-REFERENCE TO RELATED APPLICATIONS

This application claims the benefit of U.S. Provisional Patent Application No. 62/557,070 filed on Sep. 11, 2017, the entire disclosure of which is expressly incorporated herein by reference.

BACKGROUND

Technical Field

The present disclosure relates generally to equipment for cleaning solar panels. More specifically, the present disclosure relates to systems and methods for self-cleaning solar panels using an electrodynamic shield.

Related Art

In the renewable energy field, solar power generation using solar panels has gained widespread interest and increased adoption. A major challenge with existing solar panels is the reduction of output power due to dust and other particles covering the solar panel. Dust deposition on the solar panels can significantly reduce power output. The standard approach to alleviate this problem is to mechanically clean the solar panels, which requires the use of water and manual labor, or water and very expensive and error-prone robotics. Emerging approaches include the application of either hydrophobic or hydrophilic coatings to glass surfaces of the solar panels, as well as using robots to automate manual cleaning. However, repetitive mechanical cleaning can damage the glass surfaces of the solar panels while requiring vast amounts of water, which is a scarce commodity in desert regions.

Further approaches include the use of an electrodynamic shield, or "EDS." The EDS, via electrodes, generates an electric field that causes dust particles on the solar panels to experience an electrostatic force, and to be repelled from the solar panels. Use of the EDS has garnered interest in order to address dust accumulation problems on solar panels of vehicles operating on the Moon and on Mars. In the case of the Moon, a low gravity, zero magnetic field, and hard vacuum environment allow the EDS to repel dust particles. However, the EDS technique in its current embodiment is not practical for terrestrial applications, due to the Earth's humidity levels and low transparencies of electrode materials currently in use. Specifically, any layer of moisture condensing on the surface of the solar panel will shield the electric field and also act as a trap for dust particles due to the resistant forces of the moisture layer, such as dielectrophoresis forces, adhesion forces, etc. Further, with the current EDS systems, particles remain at the vicinities of electrode edges and at the middle position on top of the electrodes. These remaining particles are difficult to repel off the solar panel, even with additional electric field motivation. A combination of moisture and dust can also cause highly adhesive dust 'cake' formation, which is impossible to remove by the current EDS systems.

Accordingly, the systems and methods disclosed herein solve these and other needs by providing systems and methods for self-cleaning that do not require water or mechanical cleaning, and which addresses the moisture layer problem noted above. Specifically, the systems and methods disclosed herein solve these and other needs with a novel electrode and insulator configuration to control water adsorption, and with a novel electric pulse generator that improves cleaning efficiency and requires minimal power consumption.

SUMMARY

This present disclosure relates to systems and methods for self-cleaning solar panels using an electrodynamic shield. The system includes an electrodynamic shield ("EDS"), which contains one or more sets of electrodes, a protective film on the electrodes, a coating atop the protective film, and a substrate below the electrodes. The electrodes and the protective film are shaped and arranged to control water adsorption on the surface of the electrodynamic shield. The substrate can be a low iron soda-lime glass cover of a solar panel, which is one of the most suitable types of glass for the EDS applications. A pulse signal generator can produce a pulse signal which powers the set(s) of electrodes. The pulse signal includes a plurality of different pulse signals which have phase differences between consecutive signals. The pulse signals can include different waveforms, amplitudes, and frequencies. The pulse signal can be enhanced by a leading-edge and trailing-edge pulses, if desired. The initial pulse can provide a measurable increase in force to overcome stiction and inertia of the fixed dust particle and to reduce the net power consumed by reducing the amplitude of the subsequent pulses. A combination of pulses can be tuned for specific types of dust. The pulse signal generator, when connected to a single electrode set, generates an electric field using a standing-wave signal pattern. When connected to multiple electrode sets, the pulse signal generator generates an electric field using a traveling-wave signal pattern. By powering the set(s) of electrodes, the EDS generates an electric field that causes dust particles on the coating to experience significant electrostatic force. The electrostatic force combined with gravity cause the dust particles to be repelled off the solar panel. The sequence of pulses, in combination with the hydrophobic nature of the top coating, loosen the dust particle from the dust cake on the solar panel, which is formed due to presence of moisture. Therefore, the EDS described in the invention can clean solar panels exposed to different types of dust and environmental conditions.

BRIEF DESCRIPTION OF THE DRAWINGS

The foregoing features of the invention will be apparent from the following Detailed Description of the Invention, taken in connection with the accompanying drawings, in which:

FIG. 6 is an illustration showing an example of the electrodes of the EDS arranged into four sets and connected to a pulse signal generator;

FIG. 15 is a diagram showing various types of dust that were tested.

DETAILED DESCRIPTION

The present disclosure relates to systems and methods for self-cleaning solar panels using an electrodynamic shield, as described in detail below in connection with FIGS. 1-15.

It should first be noted that the systems and methods will be discussed below with reference to a solar panel. However, it is noted that the systems and methods of the present disclosure can be used with any system, including but not limited to, windows, vehicle surfaces, vehicle windshields, optical devices, etc., such that the electrodynamic shield allows for automatic cleaning of such objects.

Figure 1:
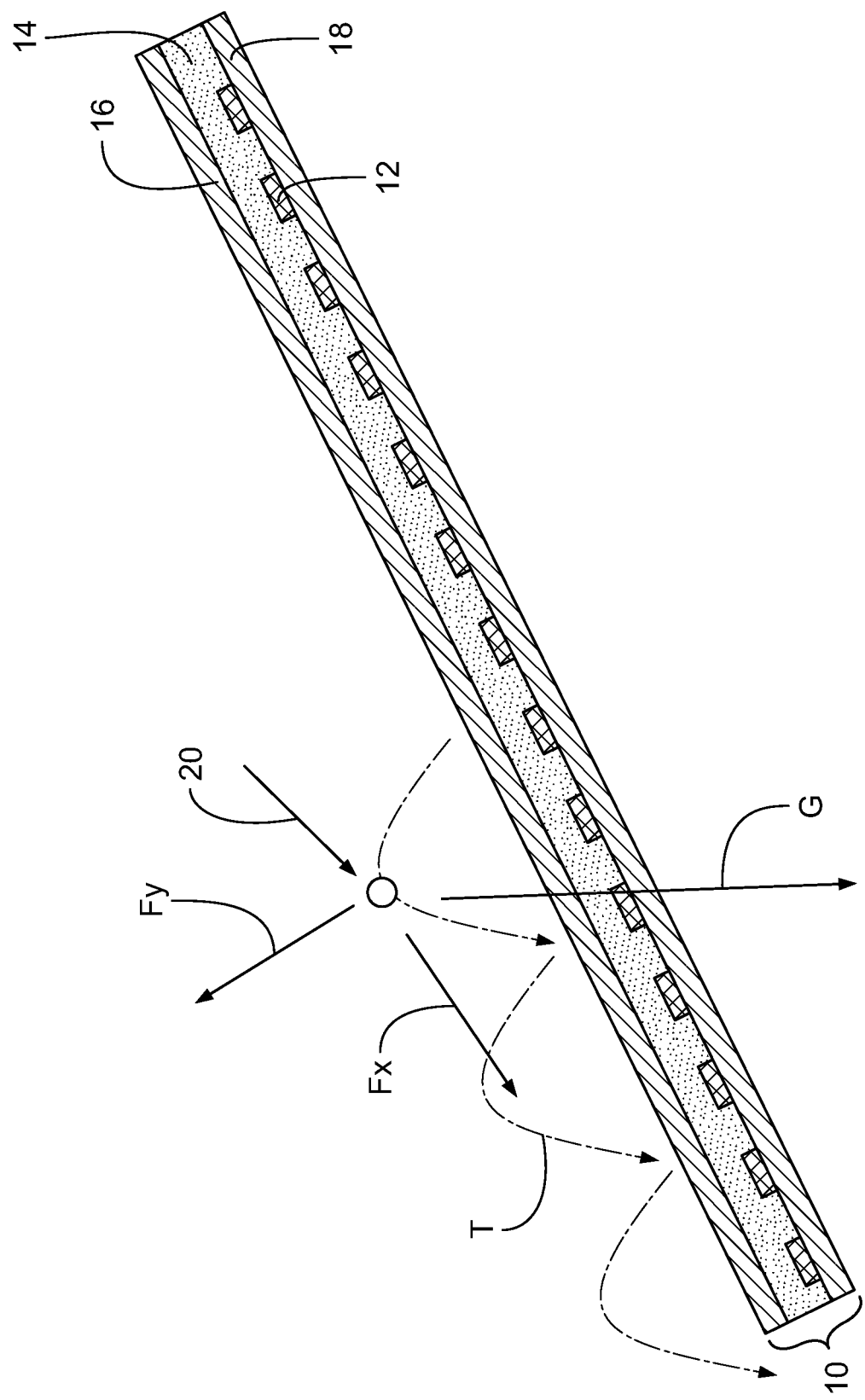
FIG. 1 is a diagram illustrating the overall system of the present disclosure.

FIG. 1 is a diagram illustrating the overall system, indicated generally at 10 (hereafter "electrodynamic shield 10" or "EDS 10"). The electrodynamic shield 10 includes one or more electrodes 12, a protection film 14, a coating 16, and a substrate 18. The electrodes 12 could be embedded within the protection film 14. The protection film is made of a material that prevents electrode breakdown. In an example, the protection film 14 is a transparent and highly dielectric silicon dioxide ("SiO$_2$"). SiO$_2$ prevents breakdown between the electrodes 12 at a high voltage. Further, SiO$_2$ protects the electrodes 12 from the environment and environmental elements. Specifically, the properties of SiO$_2$ allow for scratch resistance, moisture resistance, high transparency, etc. Those skilled in the art would understand that other materials can be used as the protection film 14, if desired, and may provide additional or different benefits.

The EDS 10 generates an electric field that causes dust particle(s) 20 to experience an electrostatic force with two vector component directions F$_x$ and F$_y$ and be repelled from the EDS 10. Gravitational forces G, which are continuously acting on the dust particle 20, help the dust particle 20 move towards the ground with a resulting particle trajectory T.

In a first example, the electrodes 12 are made of transparent Indium Tin Oxide ("ITO"). ITO is a transparent material with superior transparency, conductivity, and durability properties. The transparency of ITO can reach higher than 90%. In a second example, the electrodes 12 are made of Florine doped Tin Oxide ("FTO"). FTO is a transparent conductive oxide ("TCO") of properties comparable to ITO. Those skilled in the art would understand that other transparent materials can be used to produce the electrodes, if desired, and may provide additional or different benefits.

In an example, the width of the electrodes 12 is in a range of 0.1 to 100 micrometers ("um") and the inter-electrode spacing is in a range of 0.1 to 100 um. It should be noted that these ranges are only used as examples, and other ranges can be used. In another example, the width of the electrodes is in a range of 10 um to 400 um and the inter-electrode spacing is in a range of 10 um to 800 um. The geometry of the electrode is dependent upon the types of dust to be cleaned. For different types of dust, the efficiency depends upon different inter-electrode spacing and electrode shapes. The efficiency of the electrode is based on the balance between the sheet resistance and transparency of the electrodes.

The optically transparent coating 16 is applied to the top surface of the protection film 14. The coating 16 has one or more material properties, including but not limited to, anti-reflective properties, hydrophobic properties, etc. The material properties allow the coating to function efficiently under different conditions, such as, for example, high relative humidity. As such, the coating 16 enables the application of the EDS 10 in high humidity areas. The surface topology of the coating 16 can be altered to trap light inside and prevent loss of light due to reflection. One skilled in the art would understand how to tune the surface topology depending upon dust conditions in an applicable area.

The substrate 18 can be a rigid substrate and/or a flexible substrate. A flexible substrate can include flexible polymeric substrates such as an ethylene vinyl acetate ("EVA") film, a polyethylene terephthalate ("PET") film, a Polytetrafluoroethylene ("PTFE") film, etc. The rigid substrate can include rigid low iron soda-lime glass substrates, solar panels, windows, automotive windshields, optical devices, and other substrates.

Figure 2:
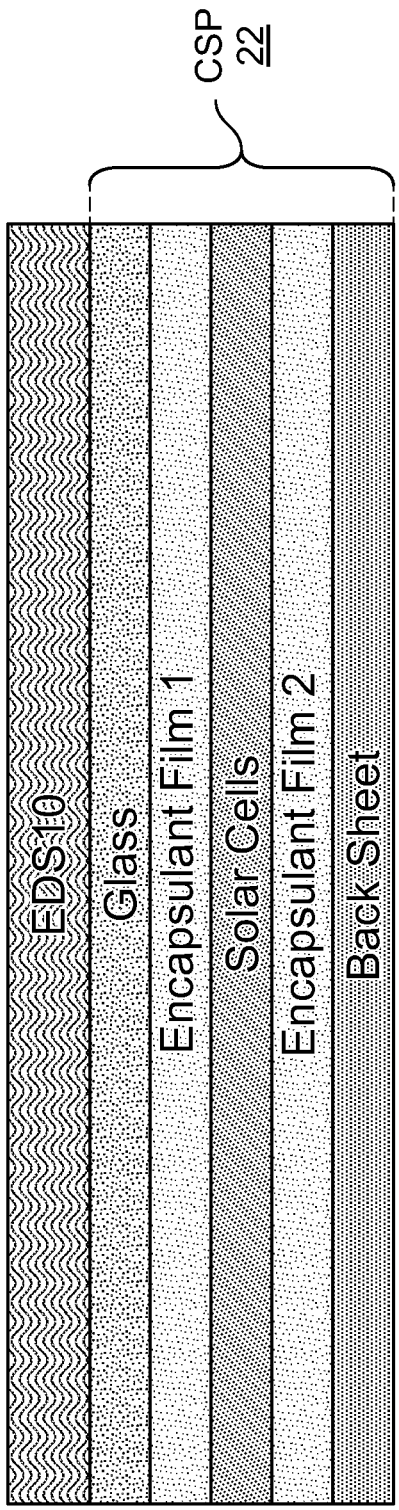
FIGS. 2-3 are diagrams illustrating the electrodynamic shield ("EDS") of the present disclosure, integrated with a solar panel.
Figure 3:
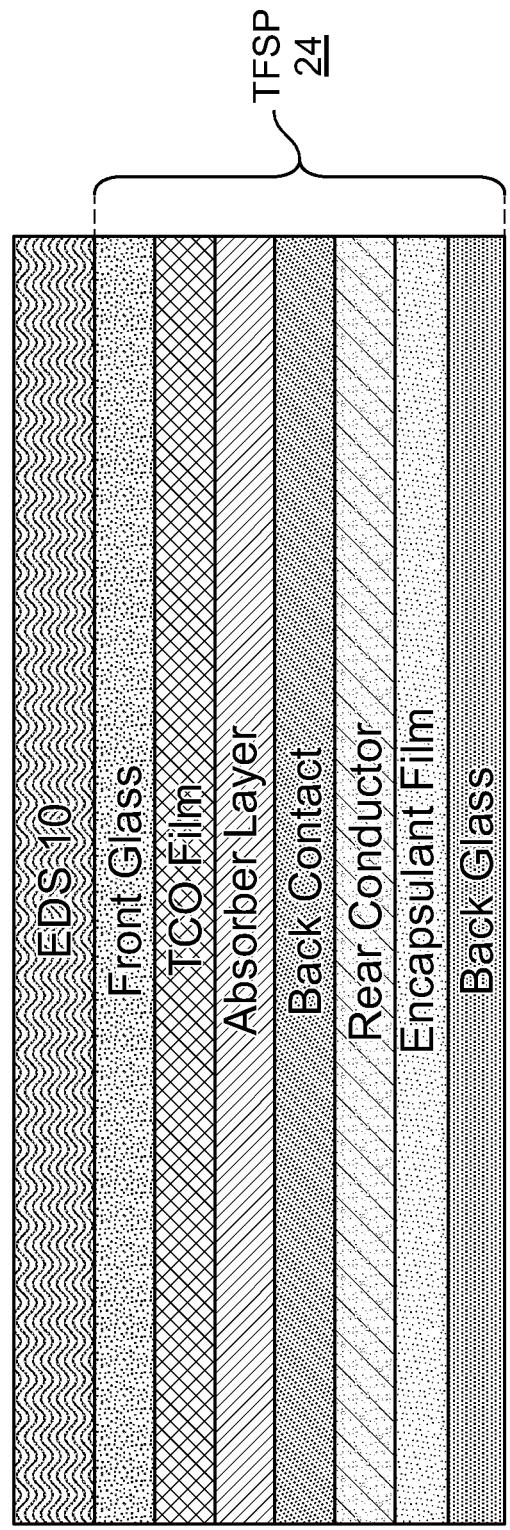

The EDS 10 is integrated with a solar panel. In an example, the EDS 10 can be integrated as the top layer of the solar panel. However, those skilled in the art would understand how to integrate the EDS 10 as any layer of the solar panel. FIG. 2 is an illustration showing the EDS 10 integrated with a crystalline solar panel ("CSP") 22. FIG. 3 is an illustration showing the EDS 10 integrated with a thin film solar panel ("TFSP") 24. It should be understood that the CSP and the TFSP are only examples of solar panels, and the EDS 10 can be integrated with any type of solar panel. It should also be understood that the EDS 10 is not limited to being used with only solar panels, and can be used with other applications, such as, but not limited to, windows, vehicle surfaces, vehicle windshields, optical devices, etc.

Figure 4:
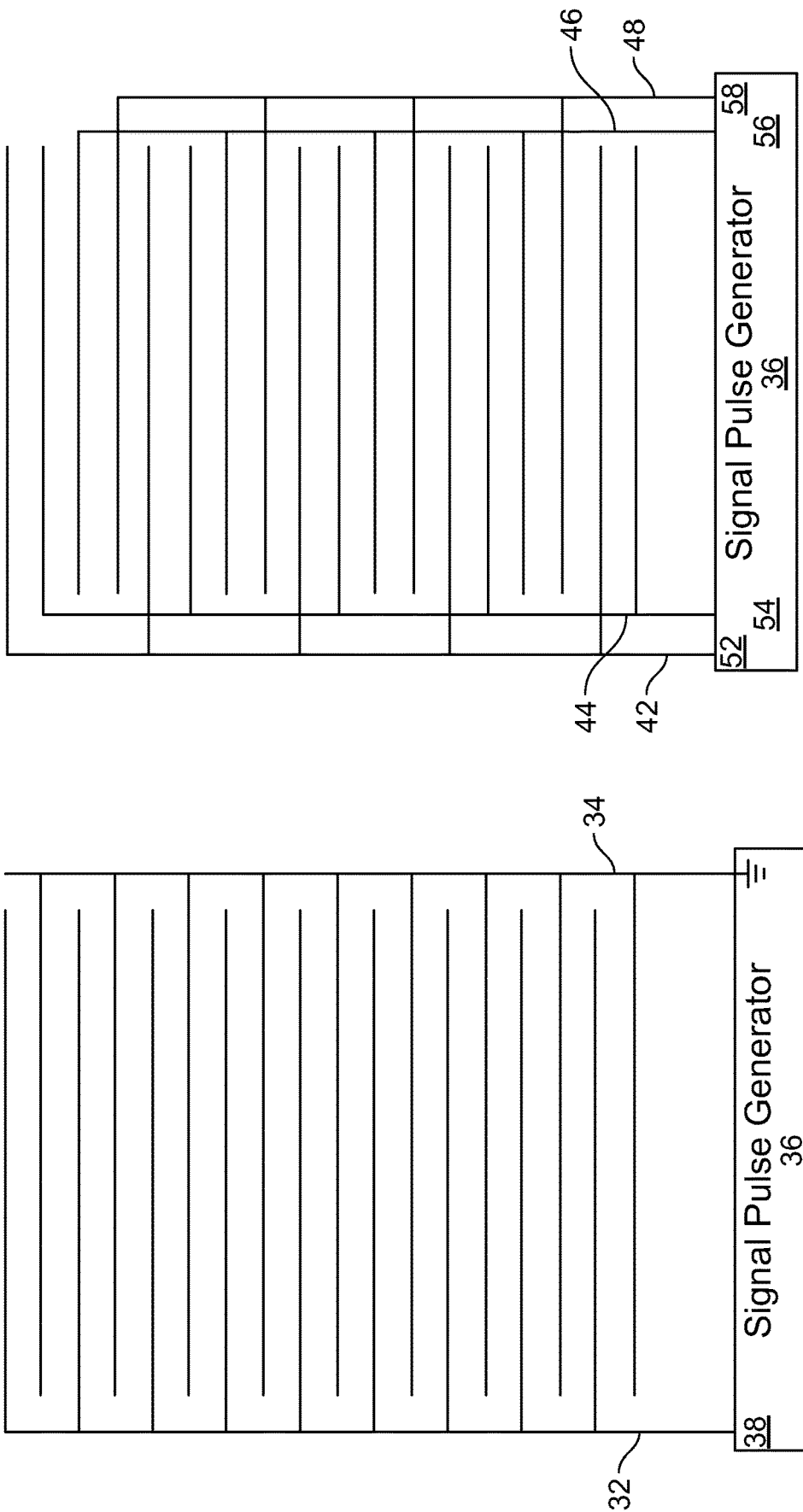
FIG. 4 is an illustration showing an example of the electrodes of the EDS arranged into two sets and connected to a pulse signal generator.

The electrodes 12 are grouped into one or more sets of electrodes. The one or more sets of electrodes can be organized into different configurations and connected to a pulse signal generator. Depending on the arrangement, different wave patterns can be generated in the electrode sets. FIG. 4 is an illustration showing a first example of the electrodes arranged into two sets 32, 34 and connected to a pulse signal generator 36. A pulse signal 38 from the pulse signal generator 36 powers the two sets of electrodes 32, 34 and generates a standing-wave pulse signal. More specifically, the pulse signal 38 powers the two sets of electrodes 32, 34 to generate an electric field that will charge the dust particles 20 and levitate them away (e.g., repel) from the surface of the EDS 10. It should be understood that solar panels are generally installed with a tilt angle (e.g., 25°-30°), and the gravitational force will aid in gliding the levitated dust particles 10 off the surface of the EDS 10.

Figure 5:
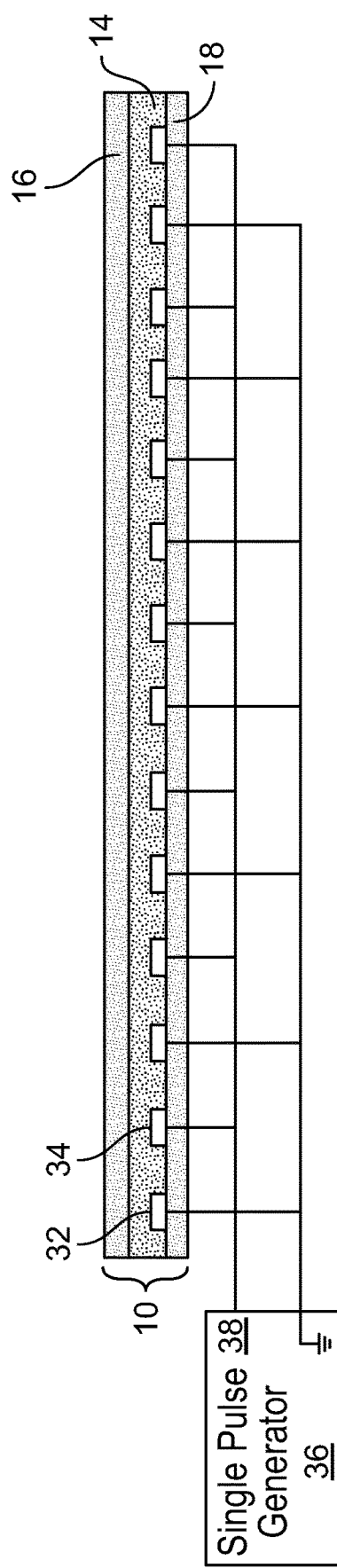
FIG. 5 is an illustration showing a cross-sectional view of the EDS of FIG. 4, including two sets of electrodes connected to the pulse signal generator generating a single standing-wave pulse signal.

FIG. 5 is an illustration showing a cross-sectional view of the EDS 10 of FIG. 4, connected to the pulse signal generator 36 for generating a single standing-wave pulse signal. The EDS 10 also includes the coating 16 on the topmost surface, the protective film 14 used to prevent the electrodes 12 from the electrical breakdown, and the substrate 18 (e.g., a low iron soda-lime glass cover substrate of the solar panel).

FIG. 6 is an illustration showing a second example of the electrodes arranged into four sets 42, 44, 46, 48 connected to the pulse signal generator 36. A pulse signal from the pulse signal generator 36 powers the four sets of electrodes 42, 44, 46, 48 and generates a traveling-wave pattern. More specifically, the pulse signal powers the four sets of electrodes 42, 44, 46, 48 with four separate pulse signals 52, 54, 56, 58. The four separate pulse signals 52, 54, 56, 58 have phase differences of 90° between consecutive signals. This form of electrode arrangement (four sets of electrodes and a traveling-wave pattern) will slide the dust particles 20 towards the edge of the EDS 10 surface and onto the ground.

Figure 7:
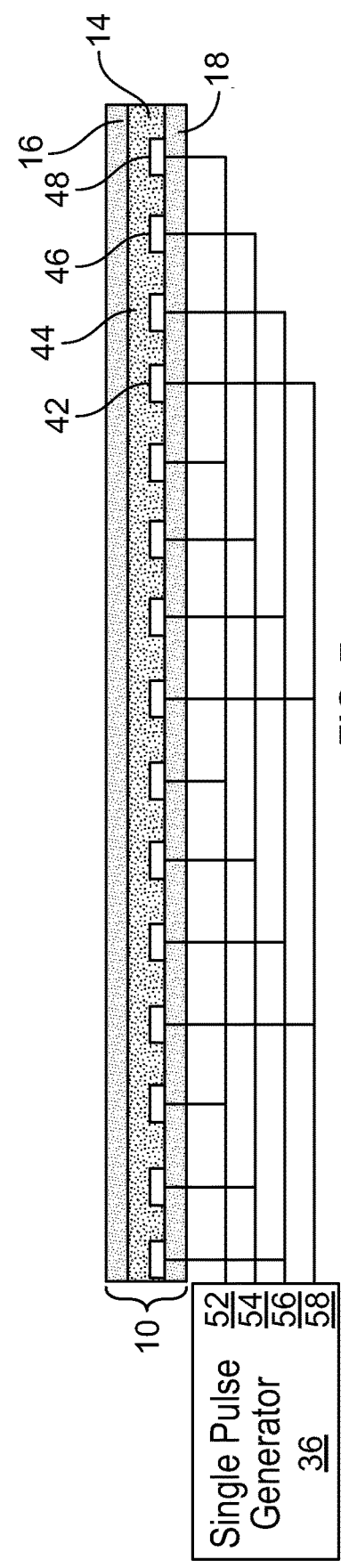
FIG. 7 illustration showing a cross-sectional view of the EDS of FIG. 6, including four sets of electrodes connected to the pulse single generator which generates the traveling-wave pattern via the four separate pulse signals.

FIG. 7 is an illustration showing a cross-sectional view of the EDS 10 of FIG. 6, connected to the pulse single generator 36 which generates the traveling-wave pattern via the four separate pulse signals 52, 54, 56, 58. It should be understood that the generation of standing waves and traveling waves by the pulse signal generator is only by way of example, and the systems, methods, and embodiments discussed throughout this disclosure can generate and use other waves, such as, but not limited to, triangular waves, sine waves, saw-tooth waves, etc.

Figure 8:
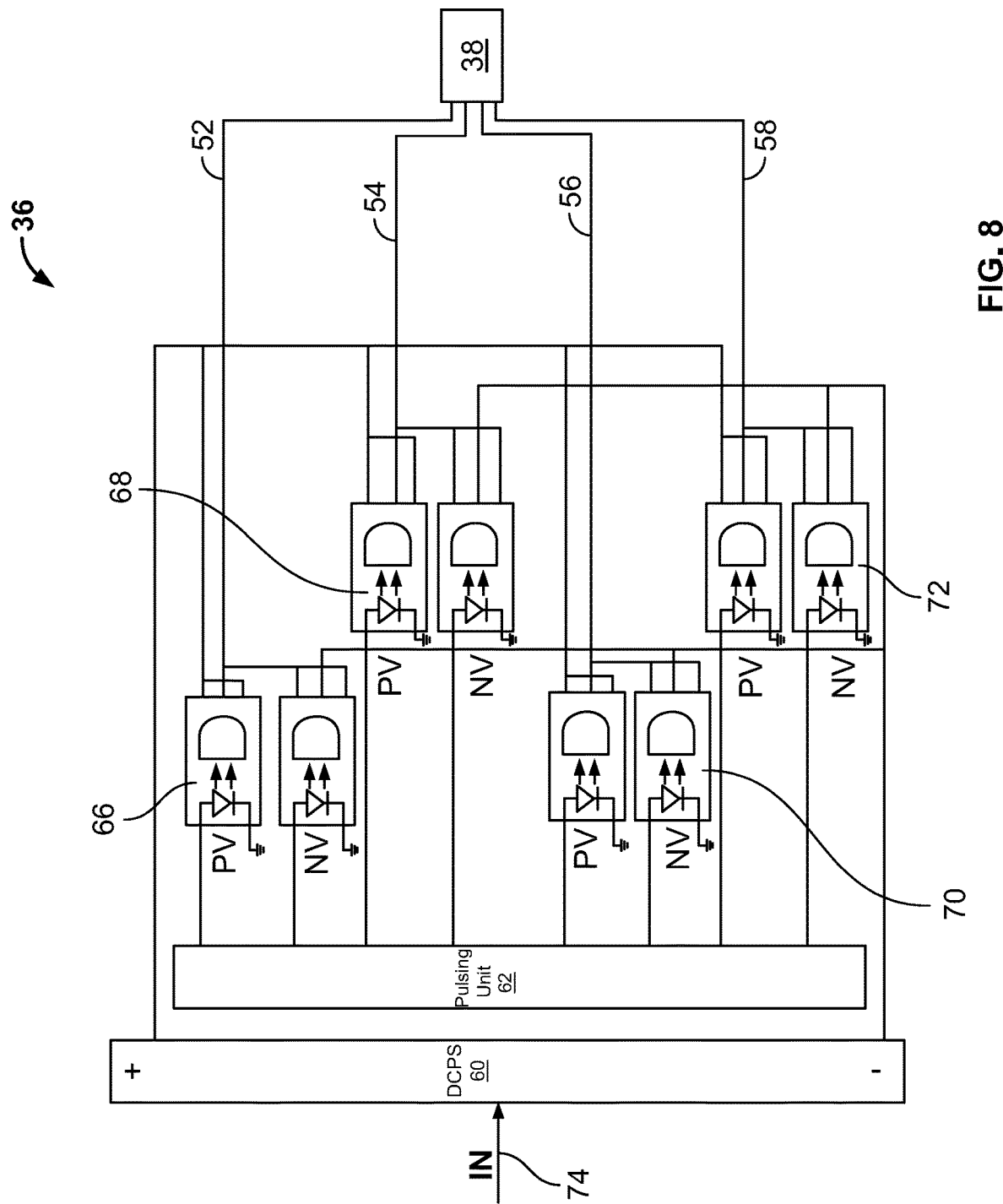
FIG. 8 is a schematic circuit diagram of the pulse signal generator of the present disclosure.
Figure 9:
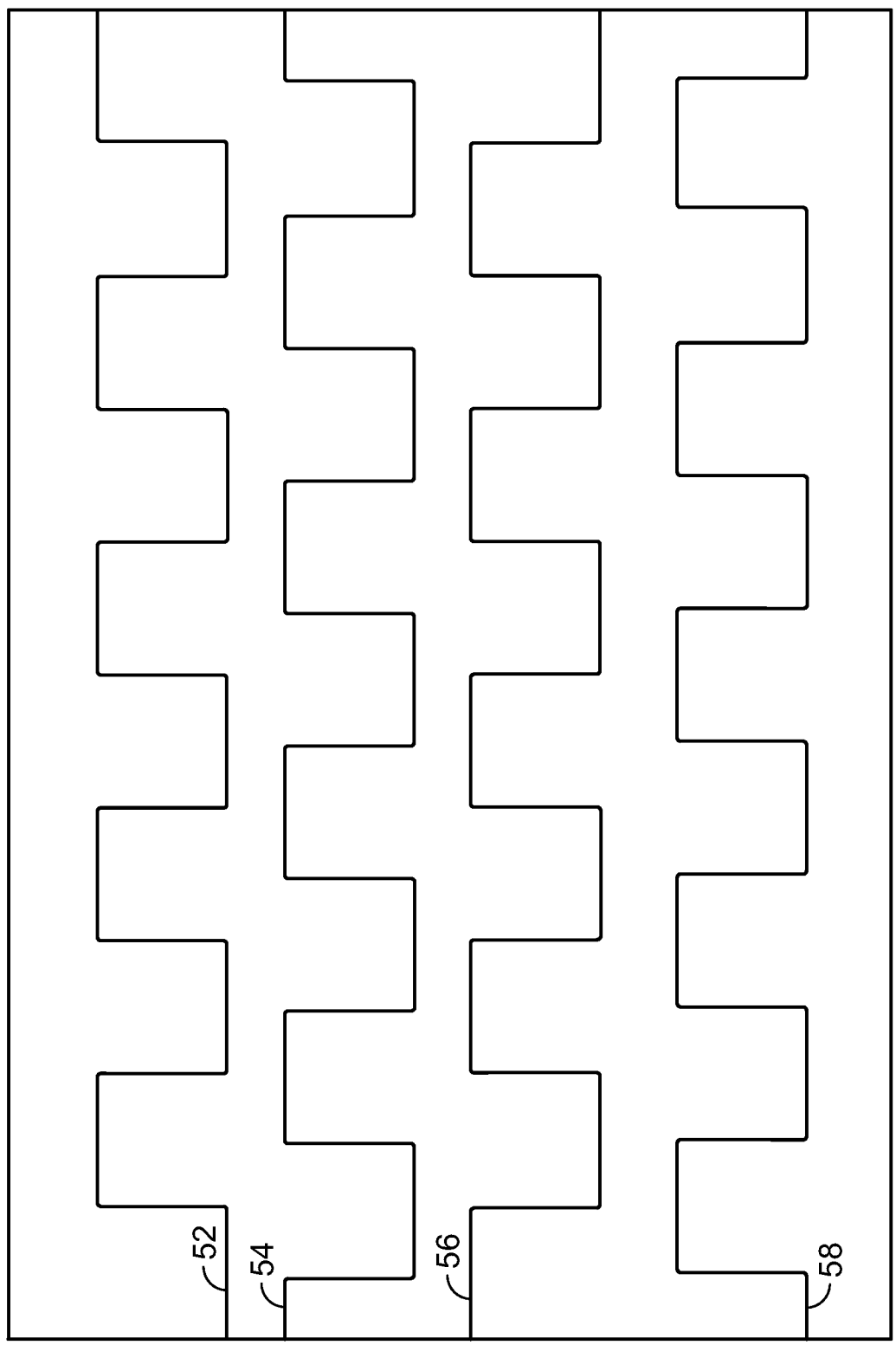
FIG. 9 is a diagram illustrating four different pulse signals generated by the system, wherein each pulse signal is shifted 90° in-phase signal.
Figure 10:
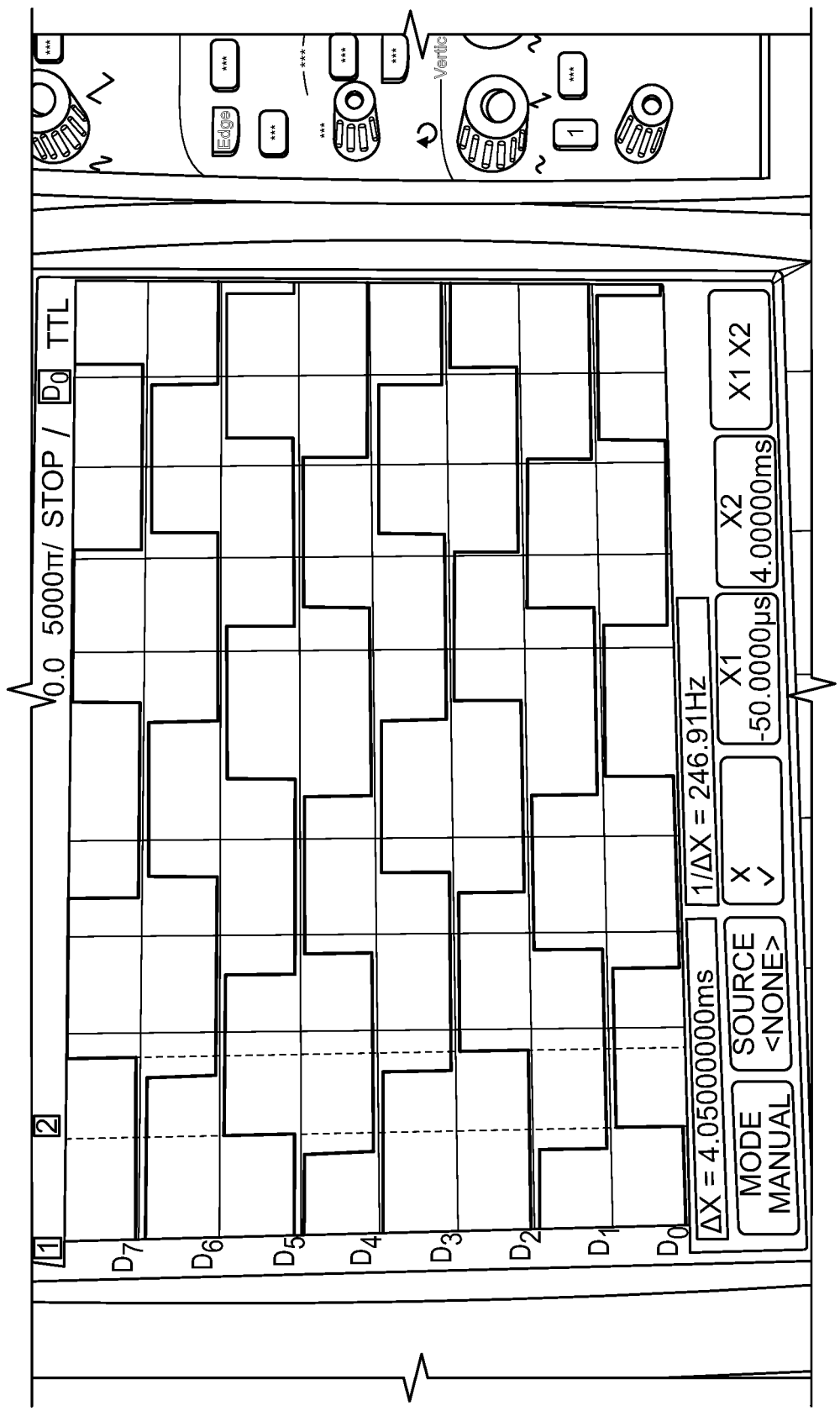
FIG. 10 is a photo of oscilloscope traces of the four different pulse signals.

FIG. 8 is a schematic circuit diagram of the pulse signal generator 36. Specifically, the schematic diagram shows the pulse signal generator 36 generating four different pulse signals 52, 54, 56, 58, which have phase differences of 90° between consecutive signals. The pulse signal generator 36, when connected to a single electrode set (e.g., electrode set 32), as shown in FIG. 4, will generate an electric field using a standing-wave signal pattern. The pulse signal generator 36, when connected to the four electrode sets 42, 44, 46, 48, as shown in FIG. 6, will generate an electric field using a traveling-wave signal pattern. The circuit includes a DC power source ("DCPS") 60, a pulsing unit 62, and four pairs of power switching transistors 66, 68, 70, and 72, which could also function as optoisolators for the pulsing unit 62. The DCPS takes power directly from a solar panel as an input 74. The pulsing unit is a computing module that provides commands to the transistors. Each pair of power switching transistors has a transistor to switch the positive voltage ("PV") and another is to switch negative voltage ("NV"). The pulse signal 38 can be a square wave of an amplitude of each signal up to a certain voltage. For example, the pulse signal 38 can be a square wave of an amplitude of each signal up to 1500V. FIG. 9 is an illustration showing the different pulse signal 52, 54, 56, and 58 with each pulse signal being shifted 90° in phase compared to a consecutive signal. FIG. 10 is a photo of four different pulse signals 52, 54, 56, and 58.

Referring back to FIG. 8, the sets of electrodes are powered by the pulse signals 38 or 52, 54, 56 and 58. The pulse signals produce an electrical field on the surface of the coating 16 and remove the particles from the surface of the solar panel. The pulse signals, when connected to a different arrangement of the sets of electrodes, will remove particles via a different methodology. Furthermore, the EDS 10 containing an arrangement of two sets of electrodes 32, 34, as illustrated in FIG. 5, will levitate the dust particles away from the surface of the EDS 10 in a hopping manner and the dust particles will reach the ground will the aid of the gravitational force. The EDS 10 containing the arrangement of four sets of electrodes 42, 44, 46, 48, as illustrated in FIG. 7, slides the dust particles in a traveling manner towards the edge of the panel, and the dust particles will fall on the ground. This eliminates or greatly reduces the need for gravitational assistance. In this manner, substrate surfaces perpendicular to the force of gravity can also be cleaned.

Figure 11B:
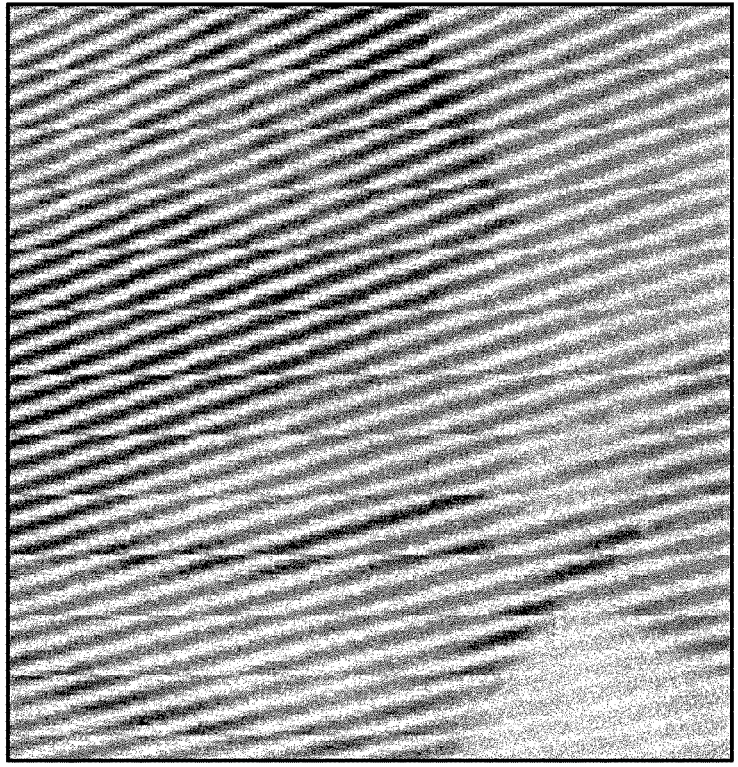
FIGS. 11A-B are diagrams showing dust particles being removed from the surface of the EDS.
Figure 11A:
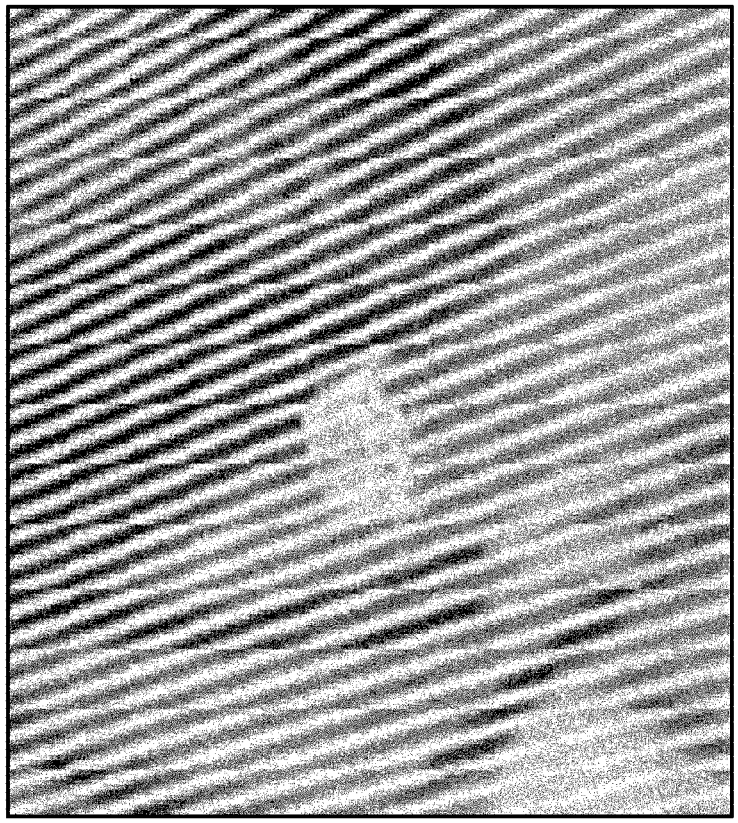

The pulse signal generator 36 can adjust the signal parameters of the pulse signals. The signal parameters include an amplitude of the signal, a frequency of the signal, etc. The amplitude of the signal and the frequency of the signal required to clean the dust particles 20 are determined by the properties of the dust particles 20, such as, but not limited to, a dust particle size, a dust particle chemical composition, and a dust particle surface charge density. Adjusting the signal parameters adjusts the electric field strength, which removes the dust particles from the surface of the EDS 10. Specifically, the electric field strength is adjusted based on the amplitude of the pulse signals, and the particle charging and removing process is adjusted based on the frequency of the pulse signals. In an example, the amplitude is in a range between 400-1000 volts and the frequency is in a range from 30 to 100 Hz. It should be understood that other ranges can also be used. FIGS. 11A-11B illustrate dust particles being removed from the surface of the EDS 10.

It should be understood that the electrostatic force that moves the dust particles grows as the dust particle size increases and is very weak for a dust particle with a small size, which makes removal of the ultra-fine particle difficult. Therefore, the dust particle size is required to grow by accretion before switching on the electrostatic force. The electrostatic force acting on the dust particle mainly depends on its size and the gradient of the square of the magnitude of the electric field. In an example, increasing the electrostatic force acting on the dust particle improves the gradient of the square of the magnitude of the electric field by enhancing the strength of the electric field. The electric field strengths can be achieved by integrating microelectrodes with smaller size and, as a result, a low voltage is so strong that the range of the controllable particle size is expanded gradually.

It should further be understood that, for better efficiency, the size of the dust particles should be less than the inter-electrode spacing. The electrode 12 width and inter-electrode separation should be on the scale of the smallest dust particle. Therefore, EDS 10 being constructed with smaller electrode width and inter-electrode spacing in the range of 10 to 100 um can be more efficient for a fine dust particle in the range of 5-100 um.

In addition to reducing the electrode gap, insulating microstructures can enhance the strength of the electric field as well. As compared to traditional electrode-exposed devices, external electrodes can be employed to generate a uniform electric field, and insulating microstructures can be embedded into microchannel to squeeze the electric field. Thereby, a high electric field gradient with a local maximum is created. The high electric field gradient has advantages in that the structure is mechanically robust and chemically inert, and a very high electric field may be applied without air breakdown discharge or arcing happening at 3 V/um at STP. While the traditional electrode-based devices use small amplitude AC signals, high amplitude DC voltages pulses can be directly applied to blocks to squeeze electric field to steer the electric field gradient to have a parallel component to the substrate instead of perpendicular to the substrate.

The dust deposition rate in a typical solar power plant located in the desert region is 0.3-0.5 g/m² per day. The deposited dust hinders the light reaching a solar cell(s) on the solar panel. Automated dust removal of dust can be performed with the addition of a sensor which responds to the loss of light reaching the solar cell. An activation system, which includes the sensor, can be programmed to activate the pulse signal generator 36 when the sensor detects a predetermined drop in light intensity reaching the solar panel and direct a small amount of power from the solar cell to the pulse signal generator 36 to generate the pulse signals.

Figure 12:
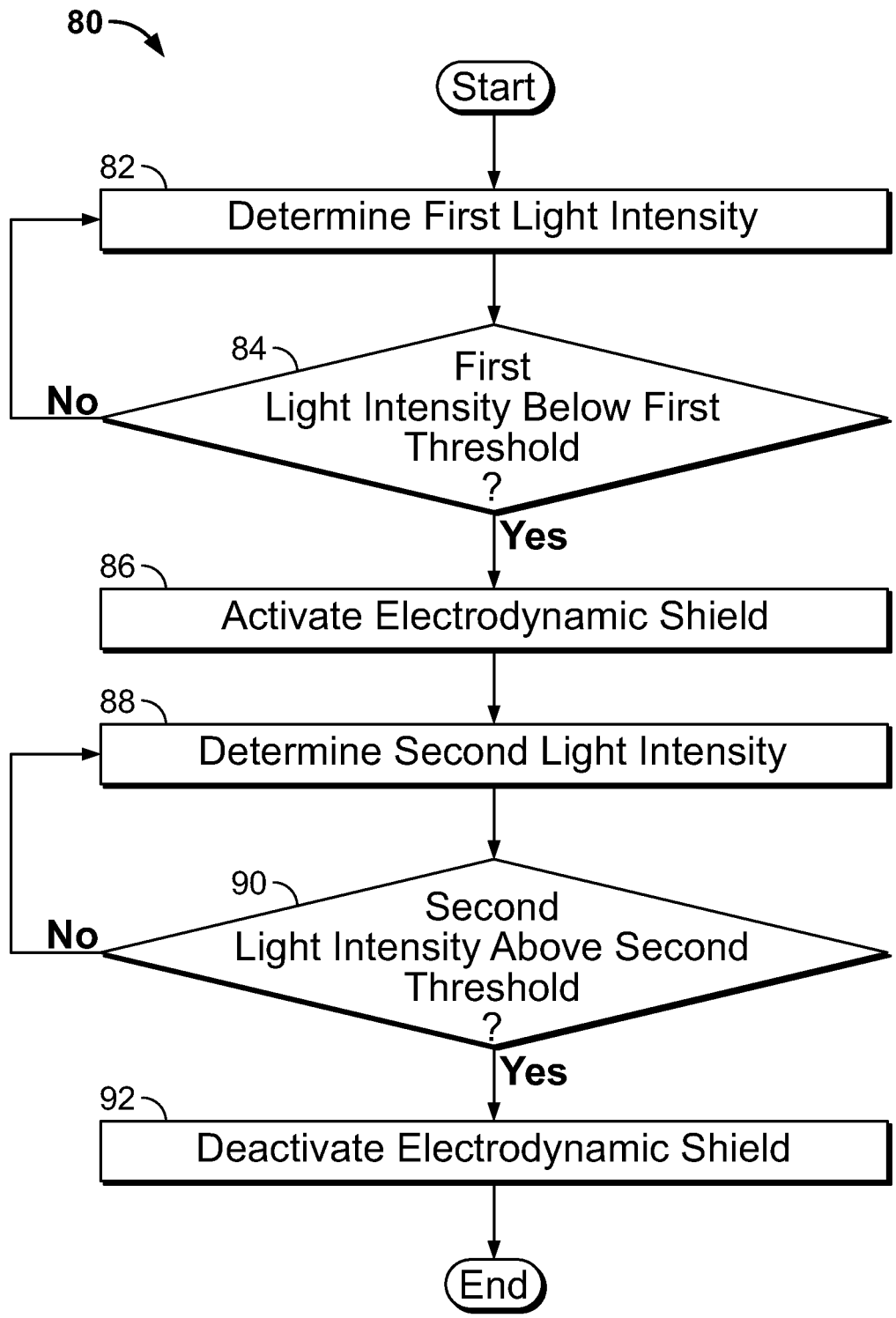
FIG. 12 is a flowchart illustrating process steps carried out by the system of the present disclosure.

FIG. 12 is a flowchart illustrating process steps carried out by the system of the present disclosure, indicated generally as method 80. In step 82, the system determines a first light intensity, where the first light intensity is an amount of light reaching the solar cell. In step 84, the system determines whether the first light intensity is below a first predetermined threshold. When the first light intensity is not below the first predetermined threshold, the system proceeds to step 82 to again determine the first light intensity. The system can again determine the first light intensity immediately, or after a predetermined time delay. When the first light intensity is below the first predetermined threshold, the system proceeds to step 86, where the system activates the EDS 10. The EDS 10, as discussed above, produces an electrical field on the surface of the coating 16 and removes the dust particles from the surface of the solar panel. In step 88, the system determines a second light intensity. In step 90, the system determines whether the second light intensity is below a second predetermined threshold. The second predetermined threshold can have the same value as the first predetermined threshold, or a different value. When the second light intensity is below the predetermined threshold, the system proceeds to step 88, and, again determines a second light intensity. The system can again determine the second light intensity immediately, or after a predetermined time delay. When the second light intensity is no longer below the second predetermined threshold, the system proceeds to step 92, where the system deactivates the EDS 10.

It should be noted that the electrodes 12 could be activated by either using a standing wave pulse signal or traveling wave pulse signal. Newer generation solar modules are optionally integrated with a power optimizer during the manufacturing process. The circuit used to activate electrodes can be incorporated into the already existing power optimizer device with the few additional steps during the manufacturing process of the solar panels.

The power optimizers have the ability to change the voltage or current to reduce system losses and have similar electronic functions that could be extended to incorporate the control in FIG. 8. The other devices are string inverters and micro-inverters. Inverters convert direct current ("DC") energy generated by the solar panels into usable alternating current ("AC") energy. Micro-inverters and power optimizers are often collectively referred to as Module-Level Power Electronics or MLPEs. MLPE technologies are rapidly gaining popularity and market share as their costs have come down.

Power optimizers are located at each panel, usually integrated into the panels themselves. However, instead of converting the DC electricity to AC electricity at the panel site, the DC electricity is conditioned, energy loss optimized and sent to a string or central inverter. This approach results in higher system efficiency than a string inverter alone. It also reduces the impact of individual or sectional panel shading on system performance and offers panel performance monitoring.

Figure 13:
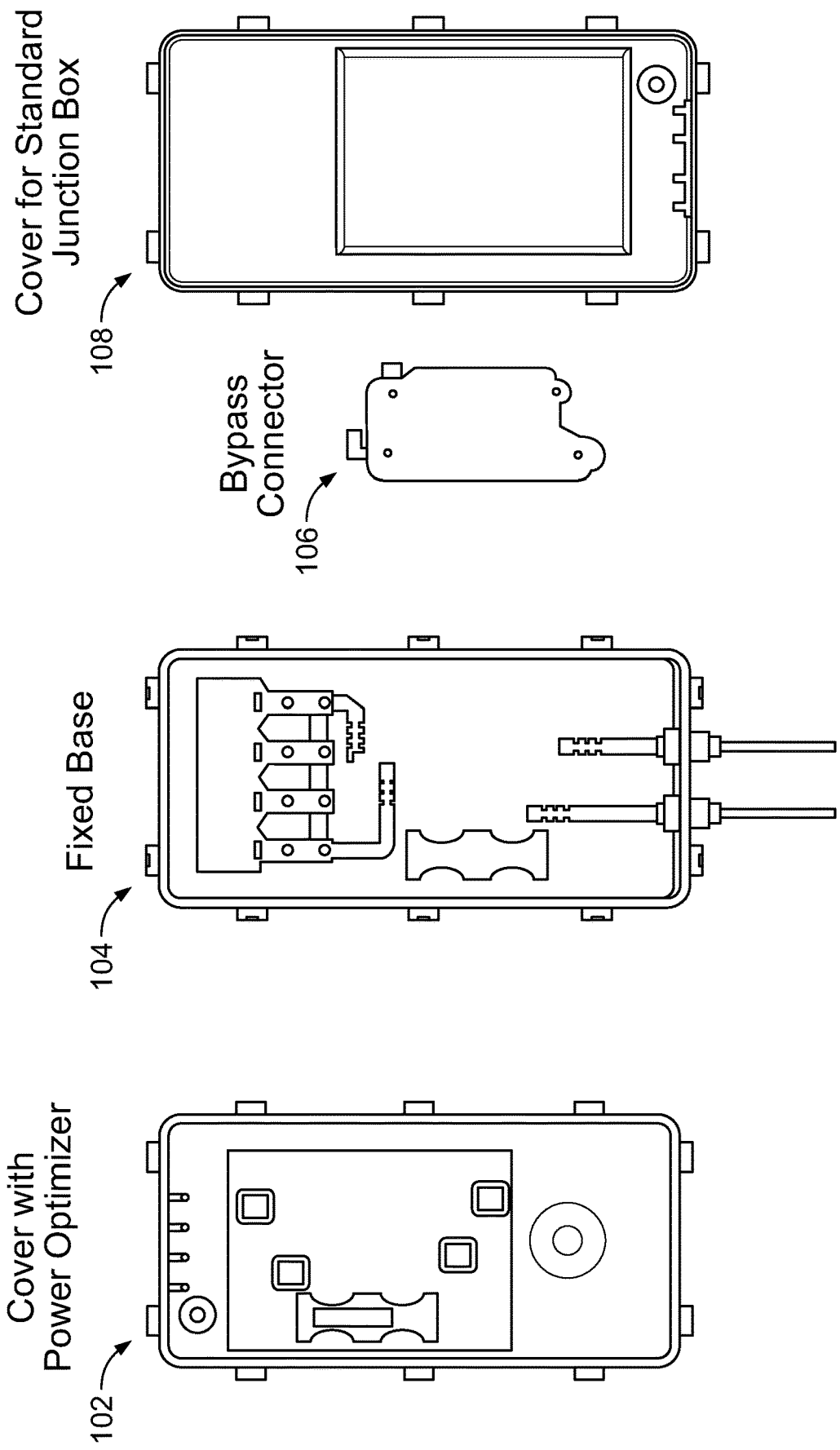
FIG. 13 is a diagram showing a cover with a power optimizer, a fixed base, a bypass connector, and a cover for a standard junction box.

The AC/DC converter can be connected by installers to each solar panel or embedded by module manufacturers, replacing the traditional solar junction box. As such, the circuit shown in FIG. 8 can be directly integrated into the power optimizer for the newer solar panel or into the junction box for the regular solar panel. This integration of the circuit into the junction box enclosure and power optimizer that is already embedded into at the back of the solar panel will also provide protection for water and dust ingression. Moreover, the junction box is typically IP67 certified, which ensures safe operation even in a harsh condition such as dust storm, high temperature, and high humidity. FIG. 13 is an illustration showing a cover with a power optimizer 102, a fixed base 104, a bypass connector 106, and a cover for a standard junction box 108. As discussed above, the circuit shown in FIG. 8 can be directly integrated into the power optimizer 102 or into the fixed base 104, and covered by the standard junction box cover 108.

Figure 14:
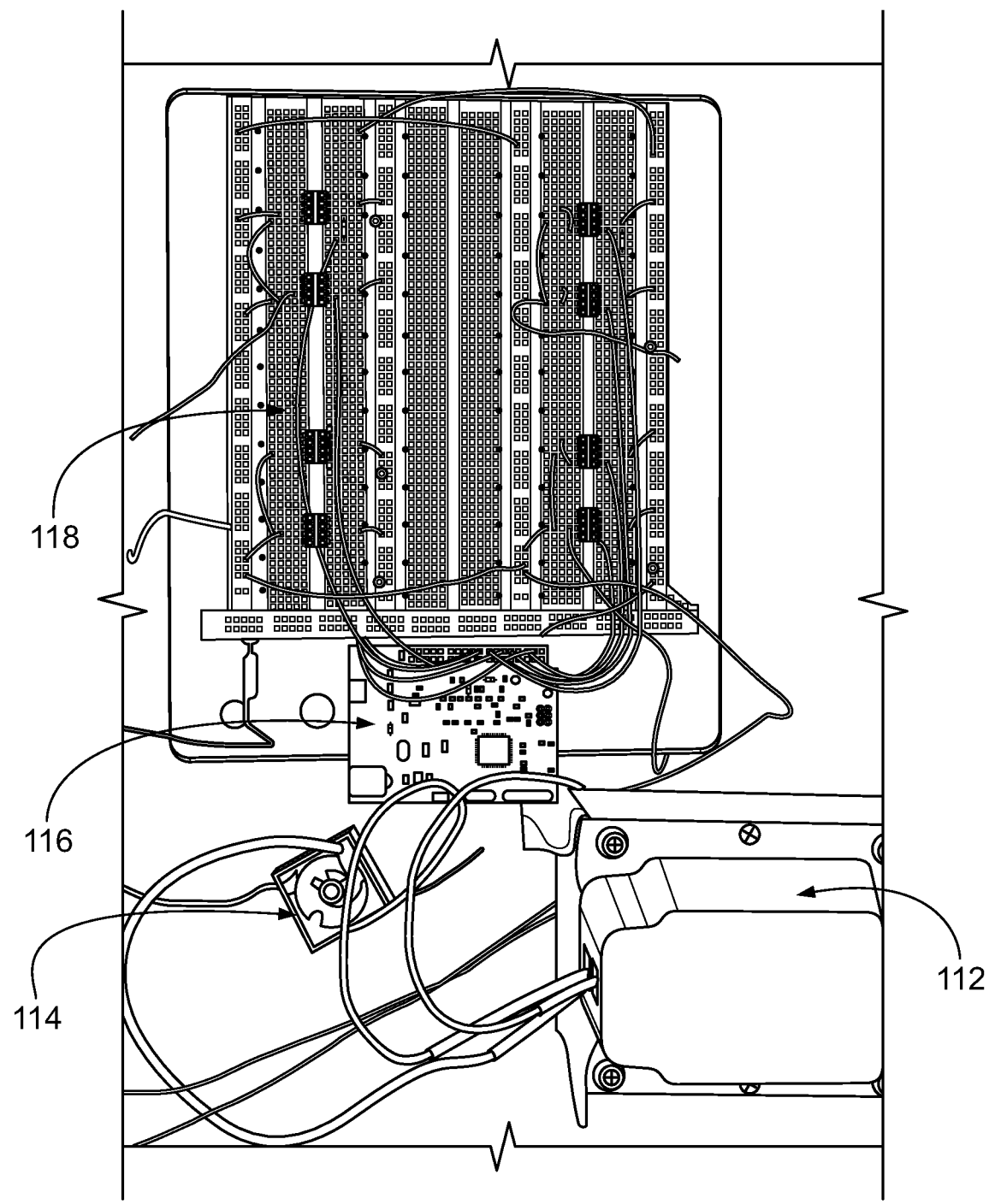
FIG. 14 is a photo of a circuit implementation of the pulse signal generator.

FIG. 14 is a photo showing a circuit implementation of the pulse signal generator. As can be seen, FIG. 14 includes a transformer, a bridge rectifier 114, a microcontroller board 116, and a plurality of integrated circuits and discrete components on a breadboard 118. The circuit implementation can be integrated into integrated into the power optimizer 102 or into the fixed base 104 of FIG. 13.

FIG. 15 is a photo showing various types of dust used for testing, including: non-porous mineral dust, porous mineral dust, hydrophobic organic dust, and hydrophilic organic dust. It was discovered that different types of dust require a different combination of amplitude, phase shifts and frequency of the pulse signal. The coating 16 with the hydrophobic properties helps the EDS 10 to clean even the most hygroscopic dust.

Having thus described the system and method in detail, it is to be understood that the foregoing description is not intended to limit the spirit or scope thereof. It will be understood that the embodiments of the present disclosure described herein are merely exemplary and that a person skilled in the art can make any variations and modification without departing from the spirit and scope of the disclosure. All such variations and modifications, including those discussed above, are intended to be included within the scope of the disclosure. What is intended to be protected by Letters Patent is set forth in the following claims.

The invention claimed is:

1. A system for self-cleaning a surface of an object, comprising:

an electrodynamic shield mounted to the surface of the object, the electrodynamic shield including one or more sets of electrodes atop a substrate, the at least one or more sets of electrodes covered in a protective film, and a coating applied to a top surface of the protective film; and a pulse signal generator having a microcontroller controlling the one or more sets of electrodes, wherein the pulse signal generator generates a pulse signal that causes the one or more sets of electrodes to generate an electric field, wherein the pulse signal comprises a plurality of different pulse signals having phase differences between consecutive signals, wherein the electric field causes a particle atop the coating to experience an electrostatic force and be repelled away from the coating, wherein the pulse generator is configured to dynamically adjust at least one of an amplitude or a frequency of the pulse signal determined by at least one of a size of the particle, a chemical composition of the particle, or a surface charge density of the particle, wherein the pulse signal generator is configured to generate a first vector force component directed along an X axis and a second vector force component directed along a Y axis, the first and second vector force components operating in conjunction with a gravitational force acting on the particle move the particle along a trajectory and off the electrodynamic shield, and wherein each electrode of the one or more sets of electrodes is controlled by a respective pair of power switching transistors connected in parallel with the electrode, a first transistor of the pair of transistors connected to a positive voltage output of a power supply and switching a positive voltage to the electrode and a second transistor of the pair of transistors connected to a negative voltage output of the power supply and switching a negative voltage to the electrode, the pair of power switching transistors being controlled by the pulse signal generator.

2. The system of claim 1, further comprising an activation subsystem, wherein the activation subsystem determines a light intensity and activates the pulse signal generator when the light intensity falls below a predetermined threshold.

3. The system of claim 1, wherein the protective film is formed from silicon dioxide.

4. The system of claim 1, wherein each electrode in the one or more sets of electrodes is formed from transparent Indium Tin Oxide or Florine doped Tin Oxide.

5. The system of claim 1, wherein the electrodes of the one or more sets of electrodes are spaced 0.1 to 100 micrometers from each other.

6. The system of claim 1, wherein each electrode of the one or more sets of electrodes has a width of 0.1 to 100 micrometers.

7. The system of claim 1, wherein the substrate is a rigid substrate or a flexible substrate.

8. The system of claim 1, wherein the object is a solar panel.

9. The system of claim 8, wherein the solar panel comprises a crystalline solar panel.

10. The system of claim 8, wherein the solar panel comprises a thin-film solar panel.

11. The system of claim 1, wherein the object is one of a window, a vehicle surface, a vehicle windshield, or an optical device.

12. The system of claim 1, wherein the coating comprises anti-reflective properties and hydrophobic properties to mitigate dust cake formation.

13. The system of claim 1, wherein a surface topology of the coating is tunable.

14. The system of claim 1, wherein when the pulse signal generator is connected to a single electrode set of the one or more sets of electrodes, the pulse signal generator generates an electric field using a standing-wave pulse signal.

15. The system of claim 1, wherein when the pulse signal is enhanced with a leading-edge or a trailing-edge pulse wave shape.

16. The system of claim 1, wherein the pulse signal generator comprises a plurality of switching elements.

17. The system of claim 1, wherein the pulse signal generator generates different pulse sequences with varying amplitudes and frequencies based on a type of dust, a particle size of the dust, and humidity levels.

18. The system of claim 1, wherein an amplitude of the pulse signal is in a range between 400-1000 volts and a frequency of the pulse signal is in a range of 30-100 Hertz.

19. The system of claim 1, wherein at least one of the pair of transistors functions as an optoisolator.

20. The system of claim 1, wherein the pulse signal generator comprises a direct current power source.

21. The system of claim 20, wherein the direct current power source receives power from a solar panel.

22. The system of claim 1, wherein the pulse signal generator is configured to adjust at least one of the amplitude or the frequency of the pulse signal during a cleaning operation performed by the system.

23. The system of claim 1, wherein the pulse signal generator is operable with a solar power optimizer, the pulse signal generator and the solar power optimizer being positioned within a junction box attached to a solar panel.

24. The system of claim 1, wherein the pulse signal generator activates the electrodynamic shield when a sensed first light intensity is below a first threshold, and deactivates the electrodynamic shield when a sensed second light intensity is above a second threshold.

* * * * *

UNITED STATES PATENT AND TRADEMARK OFFICE
CERTIFICATE OF CORRECTION

PATENT NO. : 12,269,071 B2
APPLICATION NO. : 16/646193
DATED : April 8, 2025
INVENTOR(S) : Alexander Orlov, Shrish Patel and James F. Smith Page 1 of 1

It is certified that error appears in the above-identified patent and that said Letters Patent is hereby corrected as shown below:

On the Title Page

On page 2, item (56) under the References Cited Foreign Patent Documents, Column 2, for the citation, PI0618588:
The country code "JO" should be deleted and replaced with "BR"

Signed and Sealed this
Seventeenth Day of June, 2025

Coke Morgan Stewart
*Acting Director of the United States Patent and Trademark Office*